(12) United States Patent
Henke et al.

(10) Patent No.: US 11,302,491 B2
(45) Date of Patent: *Apr. 12, 2022

(54) HIGH SPEED ARC SUPPRESSOR

(71) Applicant: Arc Suppression Technologies, Bloomington, MN (US)

(72) Inventors: Reinhold Henke, Alexandria, MN (US); Warren Kahle, Woodbury, MN (US)

(73) Assignee: Arc Suppression Technologies, Bloomington, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/984,673

(22) Filed: Aug. 4, 2020

(65) Prior Publication Data

US 2020/0365339 A1 Nov. 19, 2020

Related U.S. Application Data

(63) Continuation of application No. 16/776,433, filed on Jan. 29, 2020, now Pat. No. 10,770,241.

(Continued)

(51) Int. Cl.
*H01H 1/00* (2006.01)
*G01R 31/327* (2006.01)
(Continued)

(52) U.S. Cl.
CPC ....... *H01H 1/0015* (2013.01); *G01R 31/3272* (2013.01); *G01R 31/3277* (2013.01); *H01H 9/30* (2013.01); *H01H 9/54* (2013.01); *H01H 33/593* (2013.01); *H01H 50/045* (2013.01); *H01H 50/44* (2013.01); *H01R 13/052* (2013.01); *H01R 13/6666* (2013.01);
(Continued)

(58) Field of Classification Search
None
See application file for complete search history.

(56) References Cited

U.S. PATENT DOCUMENTS 5,420,571 A 5/1995 Coleman et al.
7,705,601 B2 4/2010 Zhou et al.
(Continued)

FOREIGN PATENT DOCUMENTS

WO 2020160194 8/2020

OTHER PUBLICATIONS

"Application Serial No. PCT US2020 015742, Response to Written Opinion and Amendment Under Article 34 Filed Nov. 25, 2020", 16 pgs.

(Continued)

*Primary Examiner* — Jermele M Hollington
(74) *Attorney, Agent, or Firm* — Schwegman Lundberg & Woessner, P.A.

(57) ABSTRACT

A high speed arc suppressor and method include a first phase-specific arc suppressor configured to suppress arcing across contacts of the power contactor in a positive domain and a second phase-specific arc suppressor configured to suppress arcing across the contacts in a negative domain. First and second high speed switches are configured to enable and disable operation of an associated one of the first and second phase-specific arc suppressors. First and second drivers are configured to drive the first and second high speed switches.

20 Claims, 6 Drawing Sheets

Related U.S. Application Data

(60) Provisional application No. 62/798,326, filed on Jan. 29, 2019, provisional application No. 62/798,316, filed on Jan. 29, 2019, provisional application No. 62/798,323, filed on Jan. 29, 2019.

(51) Int. Cl.

| | | |
|---|---|---|
| *H01H 9/30* | (2006.01) | |
| *H01H 9/54* | (2006.01) | |
| *H01H 13/66* | (2006.01) | |
| *H01H 13/70* | (2006.01) | |
| *H01H 50/04* | (2006.01) | |
| *H01R 13/05* | (2006.01) | |
| *H01R 13/66* | (2006.01) | |
| *H01R 13/70* | (2006.01) | |
| *H01R 24/30* | (2011.01) | |
| *H02H 1/00* | (2006.01) | |
| *H02H 9/08* | (2006.01) | |
| *H01H 33/59* | (2006.01) | |
| *H01H 50/44* | (2006.01) | |

(52) U.S. Cl.
CPC ............ *H01R 13/70* (2013.01); *H01R 24/30* (2013.01); *H02H 1/0015* (2013.01); *H02H 9/08* (2013.01)

(56) References Cited

U.S. PATENT DOCUMENTS

| | | | |
|---|---|---|---|
| 9,423,442 B2* | 8/2016 | Henke | ............... H01H 33/121 |
| 10,111,315 B1 | 10/2018 | Lai et al. | |
| 10,770,241 B2 | 9/2020 | Henke et al. | |
| 2005/0007715 A1 | 1/2005 | Mukai et al. | |
| 2006/0001433 A1 | 1/2006 | Bouton et al. | |
| 2008/0164961 A1 | 7/2008 | Premerlani et al. | |
| 2009/0115255 A1 | 5/2009 | Kumfer et al. | |
| 2010/0153022 A1 | 6/2010 | Chen et al. | |
| 2012/0123698 A1 | 5/2012 | Chen et al. | |
| 2013/0187389 A1 | 7/2013 | Thangamani et al. | |
| 2013/0235492 A1* | 9/2013 | Zhou | ............... H01H 9/542 361/18 |
| 2014/0091059 A1 | 4/2014 | Henke | |
| 2014/0091061 A1* | 4/2014 | Henke | ............... H01H 33/04 218/8 |
| 2014/0334050 A1 | 11/2014 | Henke | |
| 2017/0331283 A1 | 11/2017 | Potter et al. | |
| 2019/0237276 A1 | 8/2019 | Henke | |
| 2020/0243270 A1 | 7/2020 | Henke et al. | |

OTHER PUBLICATIONS

"Application Serial No. PCT US2020 015742 Written Opinion of the International Preliminary Examining Authority dated Feb. 5, 2021", 6 pgs.

"U.S. Appl. No. 16/776,433, Non Final Office Action dated Apr. 23, 2020".

"U.S. Appl. No. 16/776,433, Notice of Allowance dated Jul. 9, 2020", 8 pgs.

"U.S. Appl. No. 16/776,433, Response Filed Jun. 3, 2020 to Non-Final Office Action dated Apr. 23, 2020", 8 pgs.

"International Application Serial No. PCT/US2020/015742, International Search Report dated May 14, 2020", 5 pgs.

"International Application Serial No. PCT/US2020/015742, Written Opinion dated May 14, 2020", 6 pgs.

"International Application Serial No. PCT/US2020/015742, International Preliminary Report on Patentability dated Apr. 30, 2021", 7 pgs.

* cited by examiner

HIGH SPEED ARC SUPPRESSOR

PRIORITY

This application is a continuation application of U.S. patent application Ser. No. 16/776,433, filed. Jan. 29, 2020, now U.S. Pat. No. 10,770,241, which application claims the benefit of priority to U.S. Provisional Application Ser. No. 62/798,316, filed Jan. 29, 2019; U.S. Provisional Application Ser. No. 62/798,323, filed Jan. 29, 2019; and U.S. Provisional Application Ser. No. 62/798,326, filed Jan. 29, 2019, the contents of all which are incorporated herein by reference in their entireties.

TECHNICAL FIELD

The present application relates generally to a high speed arc suppressor.

BACKGROUND

Electrical current contact arcing may have deleterious effects on electrical contact surfaces, such as relays and certain switches. Arcing may degrade and ultimately destroy the contact surface over time and may result in premature component failure, lower quality performance, and relatively frequent preventative maintenance needs. Additionally, arcing in relays, switches, and the like may result in the generation of electromagnetic interference (EMI) emissions. Electrical current contact arcing may occur both in alternating current (AC) power and in direct current (DC) power across the fields of consumer, commercial, industrial, automotive, and military applications. Because of its prevalence, there have literally been hundreds of specific means developed to address the issue of electrical current contact arcing.

BRIEF DESCRIPTION OF THE DRAWINGS

Some embodiments are illustrated by way of example and not limitation in the figures of the accompanying drawings.

DETAILED DESCRIPTION

Arc suppressors can utilize contact separation detectors to detect a separation in the sliding contacts and/or a closing of the sliding contacts based on sudden changes in the voltage over the contacts. The contact separation detector may cause a contact bypass circuit to open in order to allow current to bypass the contacts during the transition period. However, the transition period may not, and in many cases does not, include a simple and efficient voltage transition. Rather, a series of voltage bounces may occur as the electrical contacts open or close, causing small arcs or "arclets" to form. These arclets may damage the contacts even if a primary arc is suppressed.

Systems and methods have been developed to utilize arc suppressors to suppress arc formation at the earliest stages in high-speed AC power arc generation and any related situation. Certain devices, including but not limited to brush motors and the like, operate at high speed and generate arcs and arclets comparatively rapidly. By incorporating phase-specific arc suppressors, a high speed arc suppressor may suppress arcs between positive and negative AC domains. The use of high speed switches allows the high speed arc suppressor to switch very quickly between the phase-specific arc suppressors. As a result, the high speed arc suppressor may operate in circumstances, including but not limited to brush motors, in which arcs are generated quickly and frequently.

Figure 1:
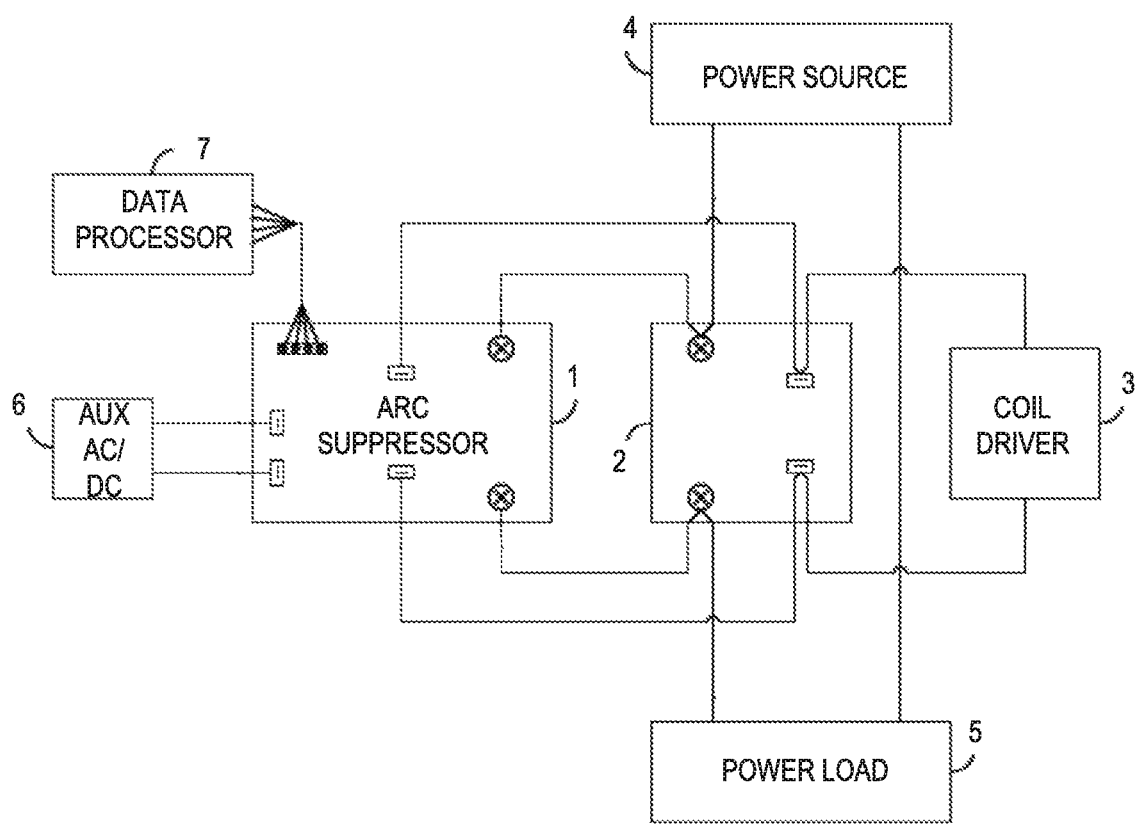
FIG. 1 is a block diagram of a system including a high speed arc suppressor, in an example embodiment.

FIG. 1 is a block diagram of a system 100 including a high speed arc suppressor 1, in an example embodiment. The system includes a power contactor 2 and a contactor coil driver 3 coupled to the power contactor 2. The high speed arc suppressor 1 and the power contactor 2 are coupled between a power source 4 and a power load 5. The power source 4 may be an AC or a DC power source, as desired for the power load 5. An auxiliary power source 6 and data processing equipment 7 are coupled to the high speed arc suppressor 1. The various blocks 1-7 are described in detail herein.

Figure 2:
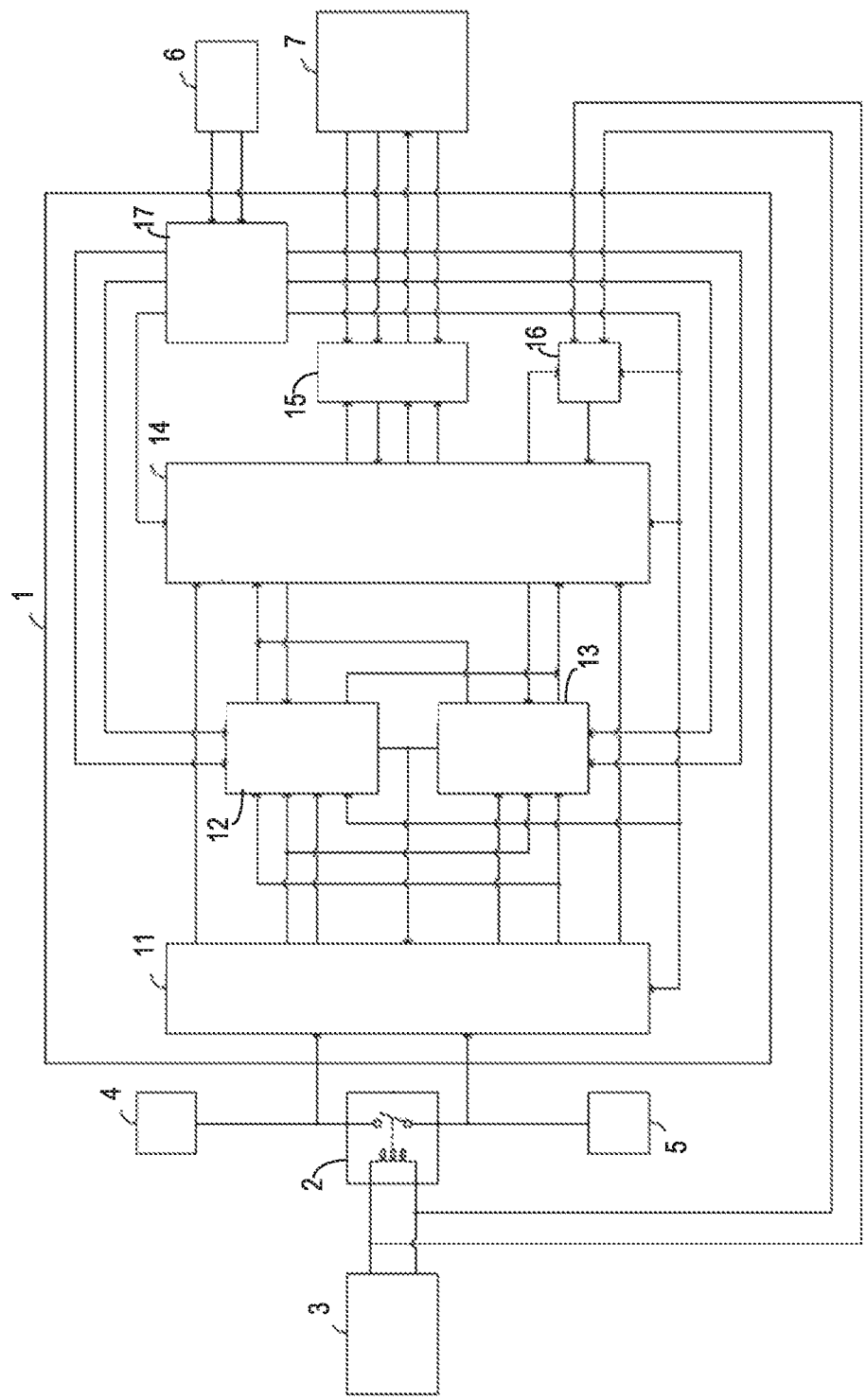
FIG. 2 is a block diagram of a system including a detailed, block-level implementation of a high speed arc suppressor, in an example embodiment.

FIG. 2 is a block diagram of the system 100 including a detailed, block-level implementation of the high speed arc suppressor 1, in an example embodiment. The high speed arc suppressor 1 includes a power contact interface 11, a first phase-specific arc suppressor 12, a second phase-specific arc suppressor 13, a microcontroller 14, a data communication interface 15, a coil power interface 16, and an auxiliary power interface 17. Example implementations of the blocks 11-17 will be illustrated in detail herein.

Figure 3:
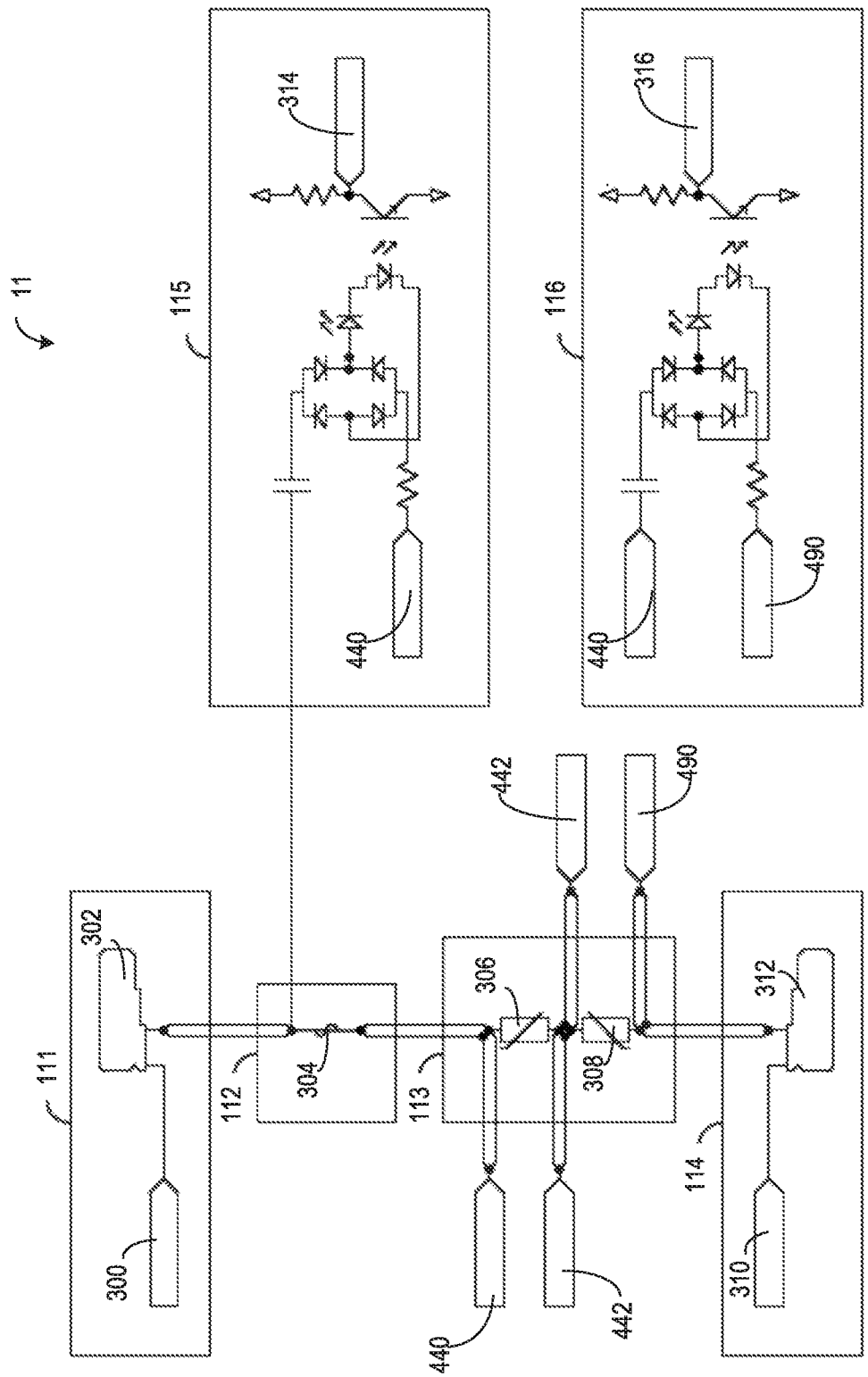
FIG. 3 is a circuit diagram of a power contact interface, in an example embodiment.

FIG. 3 is a circuit diagram of the power contact interface 11, in an example embodiment. While this circuit diagram is presented for illustrative purposes, it is to be recognized and understood that any suitable circuit level implementation may be incorporated into the high speed arc suppressor 1 as desired to achieve the functional purposes of the power contact interface 11.

The power contact interface 11 includes a first contact terminal 111, an overcurrent protection circuit 112, an over voltage protection circuit 113, a second contact terminal 114, an optional fusible element status indicator 115, and an optional power status indicator 116. The status indicators 115, 116 may be implemented as any suitable interface to provide an indication of their respective components and may include an optical element, such as a light emitting diode (LED) or other light emitting element, and/or a computer-readable output 314, 316, respectively, that may be utilized by the data processing equipment 7 and/or by an external processing device to monitor the status of the respective components.

The data processing equipment 7 may be or may include a microcontroller, a microprocessor, or other suitable controller or processor. In an example, the data processing equipment 7 is or includes a CMOS eight-bit microcontroller. In an example, the microcontroller is an AT89LP214 microcontroller produced by Atmel Corporation. However, it is to be recognized that any controller or processor that is suitably configurable may be utilized. Moreover, while the data processing equipment 7 is illustrated as being a separate component from the high speed arc suppressor 1, the data processing equipment 7 may instead be incorporated as a component of the high speed arc suppressor 1.

The first contact terminal 111 includes a first sense terminal 300 coupled to the first phase-specific arc suppressor 12 and a wire terminator and path splitter 302. The overcurrent protection circuit 112 includes a fuse 304, such as a fusible link, a fusible resistor, or a fusible printed circuit board trace. In an example, the fuse 304 is a fusible printed circuit board trace rated to one hundred seventy-five (175) Amperes.

The over voltage protection circuit 113 includes at least one over voltage protection element. As illustrated, the over voltage protection circuit 113 includes a first over voltage protection element 306 coupled between a first power line 440 and ground 442, and a second over voltage protection element 308 coupled between a second power line 490 and ground 442. In various examples, the first and second over voltage protection elements 306, 308 are varistors rated to eight hundred twenty (820) Volts and 1.2 kiloamperes. The second contact terminal 114 includes a second sense terminal 310 coupled to the second phase-specific arc suppressor 13 and a wire terminator and path splitter 312.

Figure 4A:
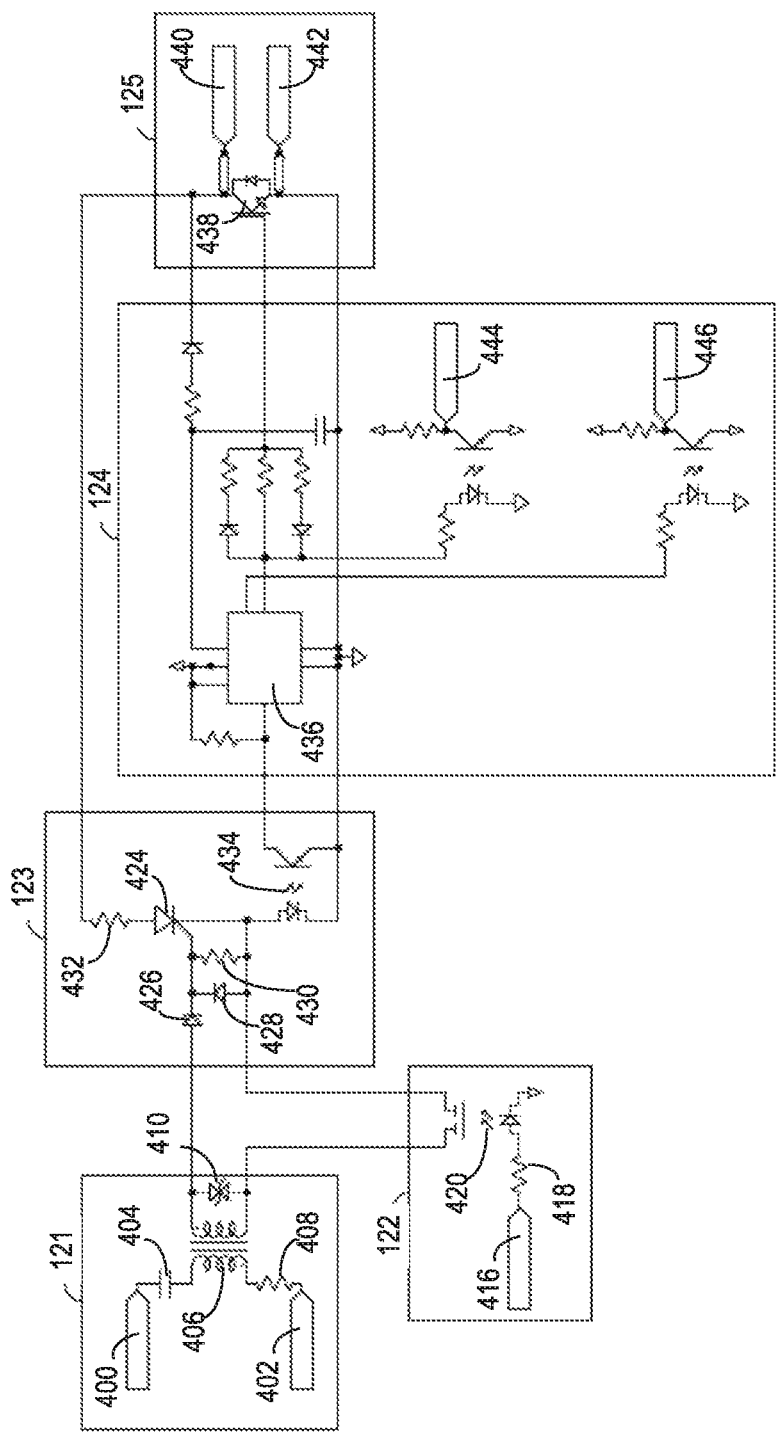
FIGS. 4A and 4B are circuit diagrams of first and second phase-specific arc suppressors, respectively, in an example embodiment.
Figure 4B:
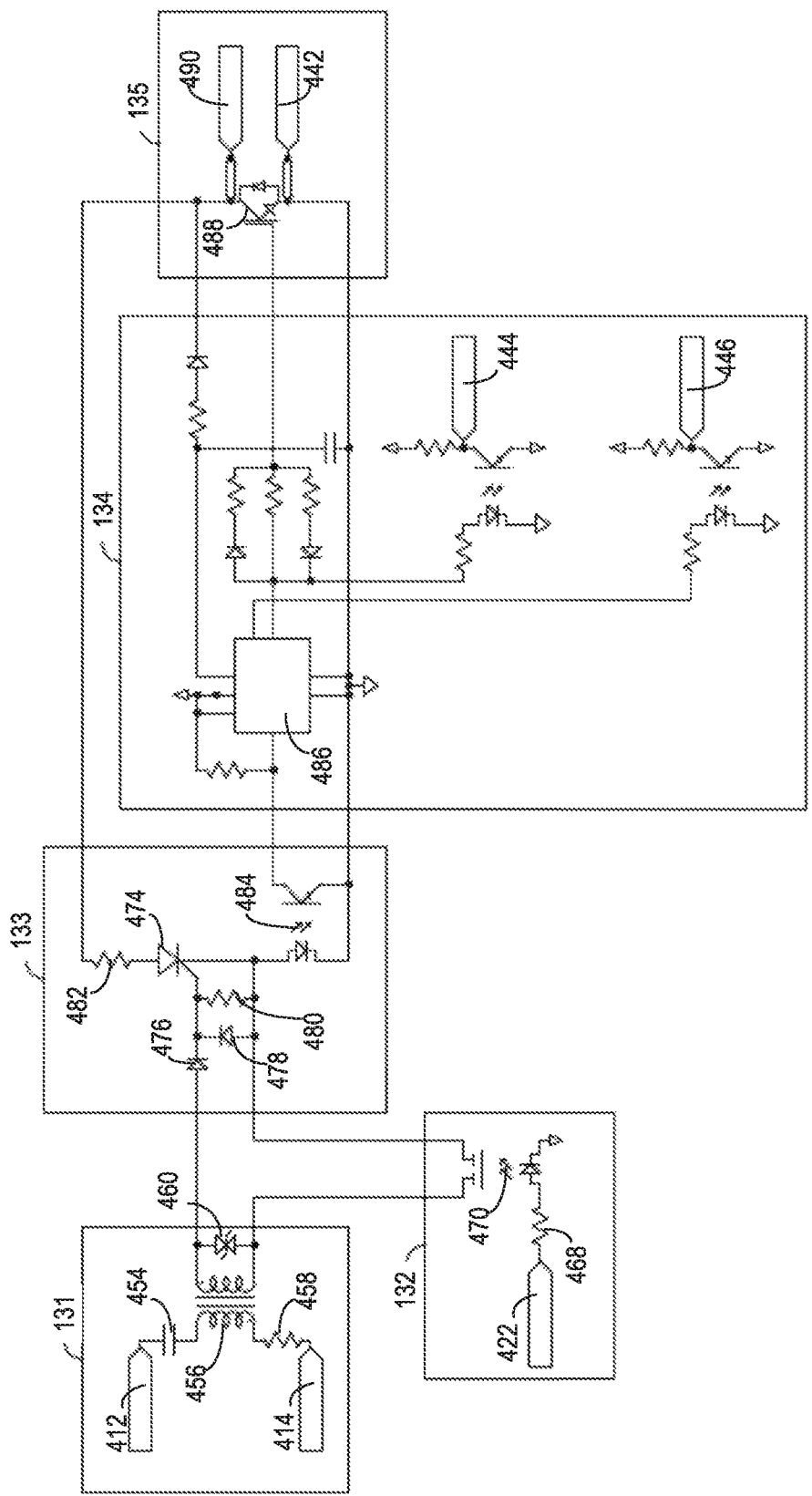

FIGS. 4A and 4B are circuit diagrams of the first and second phase-specific arc suppressors 12, 13, respectively, in an example embodiment. The first and second phase-specific arc suppressors 12, 13 respectively include an arc ignition detector circuit 121, 131; a trigger lock circuit 122, 132, an arc burn memory 123, 133; a gate driver 124, 134; and a high speed arc extinguishing element 125, 135.

The arc ignition detector circuit 121 includes a first terminal 400 coupled to the first sense terminal 300 of the first contact terminal 111 and a second terminal 402 coupled to the second contact terminal 114. The arc ignition detector circuit 131 of the second phase-specific arc suppressor 13 includes a first terminal 412 is coupled to the second contact terminal 114 and a second terminal 414 is coupled to the first contact terminal 111. Each of the arc ignition detector circuits 121, 131, respectively include a capacitor 404, 454 coupled in series between the first terminals 400, 412 and second terminals 402, 414, a transformer 406 456, and a resistor 408, 458, with a TVS diode 410, 460 coupled over the transformer 406, 458. In an example, the capacitor 404, 454 is a one hundred (100) picofarad capacitor, the transformer 406, 456 is a two-coil inductor array rated for ten (10) microhenrys with 82.6 milliohm maximum DC resistance and parallel 2.08 Amperes maximum DC current, the resistor 408, 458 is a ten (10) Ohm resistor, and the TVS diode 410, 460 is rated for a 10.3 Volt clamp and 38.8 Amperes.

The arc ignition detector circuits 121, 131 are generally configured to detect a condition indicative of a ignition of an arc in the contacts of the power contactor 2, such as a change in voltage and/or current and output an indication of the arc ignition to the trigger lock circuit 122, 132 and arc burn memory 123, 133, respectively. In various examples, the arc ignition detector circuit 121, 131 measures the current of the RC circuit created by the capacitor 404, 454 and resistor 408, 458, respectively using a current sense transformer, i.e., the transformer 406, 456.

The trigger lock circuits 122, 132 are configured to inhibit operation of the arc burn memory 123, 133, respectively, following initial detection of arc ignition by the arc ignition detector circuit 121, 131 for a predetermined period of time. The predetermined period of time may be selected based on the frequency of the AC power. In an example, the predetermined time is three hundred (300) milliseconds or less. Signals from the arc ignition detector circuit 121, 131 may be prevented from reaching the arc burn member 123, 133 during the predetermined period of time.

The trigger lock circuit 122 is controlled by an output form the microcontroller 14 at first enable line 416. The trigger lock circuit 132 is controlled by an output from the microcontroller 14 at second enable line 422. The first and second enable lines 416, 422 are respectively coupled to a resistor 418, 468 and a relay 420, 470, such as a solid state relay, over which the output of the arc ignition detector circuit 121, 131 is also coupled. A signal on the first enable line 416 from the microcontroller 14 causes the relay 420 to open and inhibit propagation of the signal from the arc ignition detector circuit 121 to the arc burn memory 123. A similar function happens based on the second enable line 422 in relation to the relay 470, arc ignition detector circuit 131, and the arc burn memory 133. As such, the operation of the trigger lock circuits 122, 132 is controlled by the microcontroller 14 independently of one another.

The arc burn memory 123, 133 incorporates a one-bit, high speed RS-type flip-flop 424, 474, respectively. Diodes 426, 428, 476, 478 and resistor 430, 480 regulate the signal from the arc ignition detector circuit 121, 131, respectively to the flip-flop 424, 474. A resistor 432, 482 provides current limitation to the flip-flop 424, 474, respectively. An optocoupler 434, 484 provides isolated output from the output from the arc burn memory 123, 133 to the gate driver 124, 134, respectively.

The gate drivers 124, 134 respectively provide a first driver 436 and a second driver 486 for high speed operation of the high speed arc extinguishing element 125, 135. The driver 436, 486 may be a chip selected for driving the gate of a first and second high speed switch 438, 488, respectively, of the high speed arc extinguishing element 125, 135, respectively, based on the output from the arc burn memory 123, 133, respectively, and, in particular, the bit stored in the flip-flop 424, 474. Where the bit indicates that an arc burn has been detected, the associated driver 436, 486 is configured to drive an output to the associated high speed switch 438, 488.

In the illustrated example, the high speed switch 438, 488 is a transistor. The high speed switch 438 is coupled between a first power line 440 and a ground line 442. The high speed switch 488 is coupled between a second power line 490 and the ground line 442. In various examples, the high speed switches 438, 488 are insulated gate bipolar transistors (IGBT) configured to switch on and off in not more than approximately ten (10) microseconds. In an example, the high speed switches 438, 488 are 1,200 Volt, one hundred five (105) Ampere, 595 Watt IGBTs. The gate driver 124, 134 includes circuitry to operate the driver 436, 486 as specified by the driver 436, 486 datasheet as well as circuitry to drive an arc indicator line 444 and a fault indicator line 446. Upon an associated arc burn memory 123, 133 storing an indication of the presence of an arc on the power contacts 2, the associated driver 436, 486 causes the associated high speed switch 438, 488 to short across the power contact 2, providing a current path to suppress arcing according to principles disclosed in U.S. Pat. No. 9,423,442, Henke, which is incorporated by reference herein in its entirety, and according to other disclosures incorporated by reference herein.

The principles disclosed with respect to the high speed arc suppressor 1 are described with respect to single-phase AC power. However, it is to be recognized and understood that the principles disclosed are applicable to multi-phase AC power, as described in the disclosures incorporated herein by reference. Thus, a multi-phase, high speed arc suppressor may be created by combining the high-speed principles with the multi-phase principles incorporated herein by reference. Similar principles apply for relatively high current applications.

Figure 5:
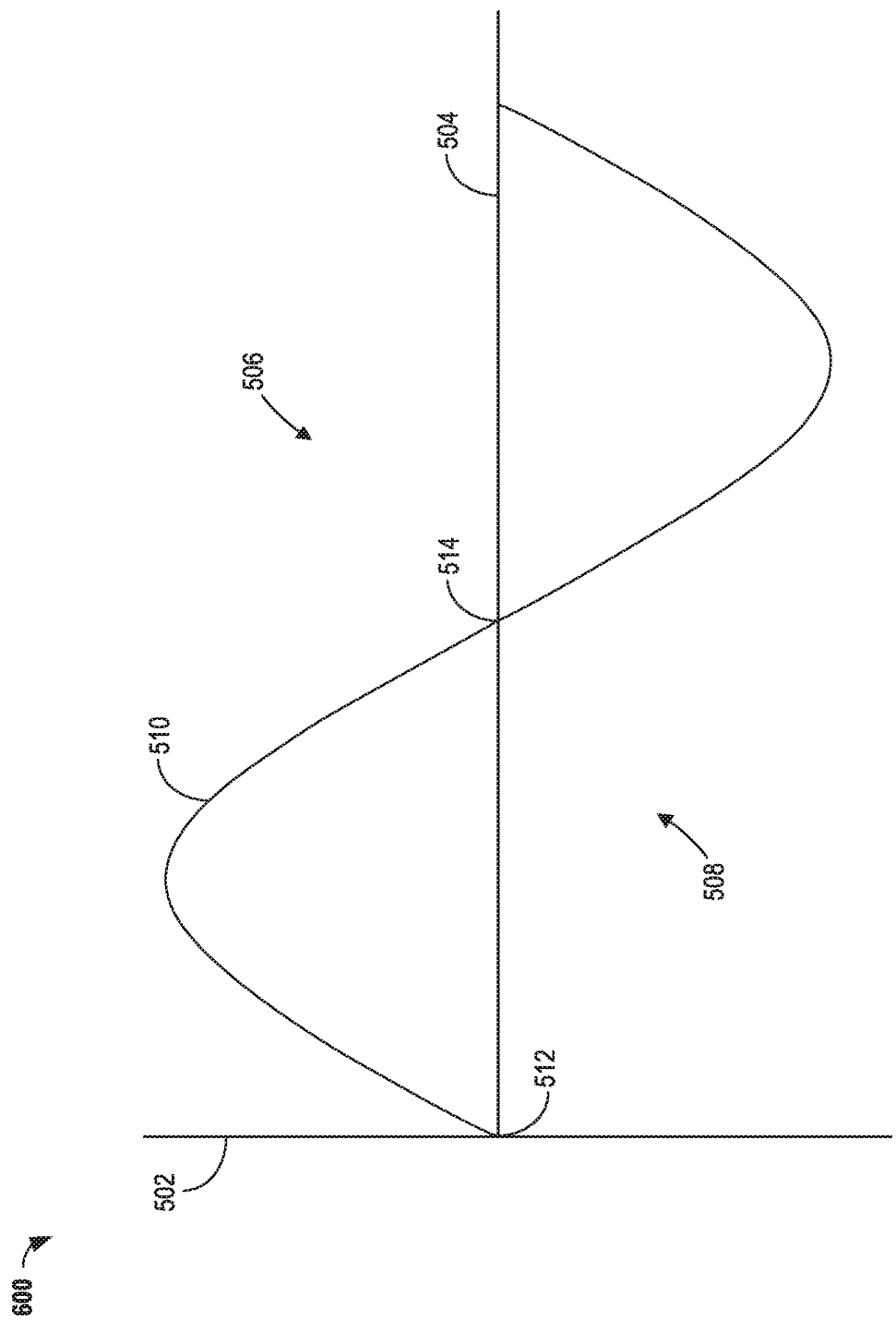
FIG. 5 illustrates an operation of a high speed arc suppressor illustrated using a waveform for an AC system, in an example embodiment.

FIG. 5 illustrates an operation of the high speed arc suppressor 1 illustrated using a waveform 500 for an AC system, in an example embodiment. The Y-axis 502 shows voltage or current amplitude relative to the phase in degrees along the X-axis or zero line 504. For the purposes of this disclosure, the positive domain 506 is all space above the zero line 504, while the negative domain 508 is all space below the zero line 504.

For the purposes of this illustration, the curve 510 represents the input to the first and second phase-specific arc suppressors 12, 13. When the input represented by the curve 510 is in the positive domain 506, the first phase-specific arc suppressor 12 is enabled while the second phase-specific arc suppressor 13 is disabled. When the input represented by the curve 510 is in the negative domain 508, the first phase-specific arc suppressor 12 is disabled while the second phase-specific arc suppressor 13 is enabled. As noted herein, the switch from enabled to disabled or vice versa occurs because the high speed switch 438, 488 goes from conducting to non-conducting or vice versa when the input crosses the zero line 804.

At 512, the curve 510 is crossing the zero line 504 on a positive slope, i.e., from the negative domain 508 to the positive domain 506. The second phase-specific arc suppressor 13 is switching from enabled to disabled and the first phase-specific arc suppressor 12 is switching from disabled to enabled. In an example, the switch time for each of the first and second phase-specific arc suppressors 12, 13 to change from enabled to disabled or vice-versa is approximately ten (10) microseconds or less.

At 514, the curve 510 is crossing the zero line 504 on a negative slope, i.e., from the positive domain 506 to the negative domain 508. The first phase-specific arc suppressor 12 is switching from enabled to disabled and the second phase-specific arc suppressor 13 is switching from disabled to enabled.

Additional Examples

The description of the various embodiments is merely exemplary in nature and, thus, variations that do not depart from the gist of the examples and detailed description herein are intended to be within the scope of the present disclosure. Such variations are not to be regarded as a departure from the spirit and scope of the present disclosure.

Example 1 is a high speed arc suppressor configured to suppress arcing across a power contactor coupled to an alternating current (AC) power source, the high speed arc suppressor comprising: a first phase-specific arc suppressor configured to suppress arcing across contacts of the power contactor in a positive domain, comprising: a first high speed switch configured to enable or disable operation of the first phase-specific arc suppressor; and a first driver, coupled to the first high speed switch, configured to cause the first high speed switch to enable operation of the first phase-specific arc suppressor when an input signal from the contacts is in the positive domain and disable operation of the first phase-specific arc suppressor when the input signal from the contacts is in a negative domain; and a second phase-specific arc suppressor configured to suppress arcing across the contacts in a negative domain, comprising: a second high speed switch configured to enable or disable operation of the second phase-specific arc suppressor; and a second driver, coupled to the second high speed switch, configured to cause the second high speed switch to enable operation of the first phase-specific arc suppressor when an input signal from the contacts is in the negative domain and disable operation of the first phase-specific arc suppressor when the input signal from the contacts is in the positive domain.

In Example 2, the subject matter of Example 1 includes, wherein the first and second high speed switches are configured to switch the first and second phase-specific arc suppressors between the enable operation and the disable operation in not more than ten (10) microseconds.

In Example 3, the subject matter of any one or more of Examples 1 and 2 includes, wherein the first and second high speed switches are transistors.

In Example 4, the subject matter of any one or more of Examples 1-3 includes, wherein the first and second high speed switches are insulated gate bipolar transistors (IGBT).

In Example 5, the subject matter of any one or more of Examples 1-4 includes, wherein each of the first and second phase-specific arc suppressors further comprises: an arc ignition detector circuit; a trigger lock circuit; and an arc burn memory.

In Example 6, the subject matter of any one or more of Examples 1-5 includes, wherein, for each of the first and second phase-specific arc suppressors, the arc ignition detector circuit is coupled over the power contactor, the arc burn memory is coupled between the arc ignition detector circuit and the first and second driver, respectively, and the trigger lock circuit is coupled between the arc ignition detector circuit.

In Example 7, the subject matter of any one or more of Examples 1-6 includes, wherein the trigger lock circuit is configured to inhibit operation of an associated one of the first and second phase-specific arc suppressors during a predetermined time.

In Example 8, the subject matter of any one or more of Examples 1-7 includes, wherein the arc burn memory is configured to output to the associated driver an indication of a detection of an arc burn across the power contactor.

In Example 9, the subject matter of any one or more of Examples 1-8 includes, wherein the arc burn memory comprises a one-bit flip-flop.

In Example 10, the subject matter of any one or more of Examples 1-9 includes, wherein the arc ignition detector circuit is configured to detect at least one of a change in voltage or a change in current over the power contactor indicative of the ignition of an arc.

In Example 11, the subject matter of any one or more of Examples 1-includes, a power contact interface coupled over the power contactor and between the power contactor and the arc ignition detector circuit.

In Example 12, the subject matter of any one or more of Examples 1-11 includes, wherein the power contact interface comprises an over voltage protection circuit and an over current protection circuit.

In Example 13, the subject matter of any one or more of Examples 1-12 includes, wherein each of the first and second phase-specific arc suppressors each comprise an arc extinguishing element, wherein the arc extinguishing element of the first phase-specific arc suppressor includes the first high speed switch and the arc extinguishing element of the second phase-specific arc suppressor includes the second high speed switch.

In Example 14, the subject matter of any one or more of Examples 1-13 includes, wherein the one of the first and second high speed switches is configured to short across the power contacts upon the arc burn memory of the associated one of the first and second phase-specific arc suppressors storing an indication of existence of an arc across the power contacts.

Example 15 is a method of operation a high speed arc suppressor, comprising: enabling a first phase-specific arc suppressor of the high speed arc suppressor to suppress arcing across contacts of a power contactor when an alternating current (AC) signal from the power contactor is in a positive domain; disabling a second phase-specific arc suppressor of the high speed arc suppressor to suppress arcing across the contacts when the signal is in the positive domain; and upon the signal crossing into a negative domain: switching a first high speed switch of the first phase-specific arc suppressor to disable operation of the first phase-specific arc suppressor to suppress arcing across the contacts; and switching a second high speed switch of the first phase-specific arc suppressor configured to enable operation of the second phase-specific arc suppressor to suppress arcing across the contacts.

In Example 16, the subject matter of Example 15 includes, wherein the first and second high speed switches are configured to switch the first and second phase-specific arc suppressors between the enable operation and the disable operation in not more than ten (10) microseconds.

In Example 17, the subject matter of any one or more of Examples 15 and 16 includes, wherein the first phase-specific arc suppressor comprises a first driver and the second phase-specific arc suppressor comprises a second driver, and wherein switching the first and second high speed switches comprises driving the first and second high speed switches with the first and second drivers, respectively.

In Example 18, the subject matter of any one or more of Examples 15-17 includes, wherein the first and second high speed switches are insulated gate bipolar transistors (IGBT).

In Example 19, the subject matter of any one or more of Examples 15-18 includes, wherein the each of the first and second phase-specific arc suppressors comprise a trigger lock configured to inhibit operation of an associated one of the first and second phase-specific arc suppressor for a predetermined time following an initial detection of an arc.

In Example 20, the subject matter of any one or more of Examples 15-19 includes, wherein the predetermined time is not more than three hundred (300) milliseconds.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

The above detailed description includes references to the accompanying drawings, which form a part of the detailed description. The drawings show, by way of illustration, specific embodiments. These embodiments are also referred to herein as "examples." Such examples may include elements in addition to those shown and described. However, the present inventor also contemplates examples in which only those elements shown and described are provided.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 172(b), to allow the reader to quickly ascertain the nature of the technical disclosure. It is submitted with the understanding that it will not be used to interpret or limit the scope or meaning of the claims. In addition, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment.

What is claimed is:

1. A high speed arc suppressor configured to suppress arcing across a power contactor coupled to an alternating current (AC) power source, the high speed arc suppressor comprising:
    a first phase-specific arc suppressor configured to suppress arcing across contacts of the power contactor in a positive domain, comprising:
    a first high speed switch configured to enable or disable operation of the first phase-specific arc suppressor; and
    a first driver, coupled to the first high speed switch, which causes the first high speed switch to enable operation of the first phase-specific arc suppressor when an input signal from the contacts is in the positive domain and disable operation of the first phase-specific arc suppressor when the input signal from the contacts is in a negative domain; and
    a second phase-specific arc suppressor configured to suppress arcing across the contacts in a negative domain, comprising:
    a second high speed switch configured to enable or disable operation of the second phase-specific arc suppressor; and
    a second driver, coupled to the second high speed switch, which causes the second high speed switch to enable operation of the first phase-specific arc suppressor when an input signal from the contacts is in the negative domain and disable operation of the first phase-specific arc suppressor when the input signal from the contacts is in the positive domain.

2. The high speed arc suppressor of claim 1, wherein the first and second high speed switches are configured to switch the first and second phase-specific arc suppressors between the enable operation and the disable operation in not more than ten (10) microseconds.

3. The high speed arc suppressor of claim 2, wherein the first and second high speed switches are transistors.

4. The high speed arc suppressor of claim 3, wherein the first and second high speed switches are insulated gate bipolar transistors (IGBT).

5. The high speed arc suppressor of claim 3, wherein each of the first and second phase-specific arc suppressors further comprises:
an arc ignition detector circuit;
a trigger lock circuit; and
an arc burn memory.

6. The high speed arc suppressor of claim 5, wherein, for each of the first and second phase-specific arc suppressors, the arc ignition detector circuit is coupled over the power contactor, the arc burn memory is coupled between the arc ignition detector circuit and the first and second driver, respectively, and the trigger lock circuit is coupled between the arc ignition detector circuit.

7. The high speed arc suppressor of claim 6, wherein the trigger lock circuit is configured to inhibit operation of an associated one of the first and second phase-specific arc suppressors during a predetermined time.

8. The high speed arc suppressor of claim 7, wherein the arc burn memory is configured to output to the associated driver an indication of a detection of an arc burn across the power contactor.

9. The high speed arc suppressor of claim 8, wherein the arc burn memory comprises a one-bit flip-flop.

10. The high speed arc suppressor of claim 8, wherein the arc ignition detector circuit is configured to detect at least one of a change in voltage or a change in current over the power contactor indicative of the ignition of an arc.

11. The high speed arc suppressor of claim 10, further comprising a power contact interface coupled over the power contactor and between the power contactor and the arc ignition detector circuit.

12. The high speed arc suppressor of claim 11, wherein the power contact interface comprises an over voltage protection circuit and an over current protection circuit.

13. The high speed arc suppressor of claim 11, wherein each of the first and second phase-specific arc suppressors each comprise an arc extinguishing element, wherein the arc extinguishing element of the first phase-specific arc suppressor includes the first high speed switch and the arc extinguishing element of the second phase-specific arc suppressor includes the second high speed switch.

14. The high speed arc suppressor of claim 13, wherein the one of the first and second high speed switches is configured to short across the power contacts upon the arc burn memory of the associated one of the first and second phase-specific arc suppressors storing an indication of existence of an arc across the power contacts.

15. A method of operation a high speed arc suppressor, comprising:
enabling a first phase-specific arc suppressor of the high speed arc suppressor to suppress arcing across contacts of a power contactor when an alternating current (AC) signal from the power contactor is in a positive domain;
disabling a second phase-specific arc suppressor of the high speed arc suppressor to suppress arcing across the contacts when the signal is in the positive domain; and
upon the signal crossing into a negative domain:
switching a first high speed switch of the first phase-specific arc suppressor to disable operation of the first phase-specific arc suppressor to suppress arcing across the contacts; and
switching a second high speed switch of the first phase-specific arc suppressor to cause operation of the second phase-specific arc suppressor to suppress arcing across the contacts.

16. The method of claim 15, wherein the first and second high speed switches are configured to switch the first and second phase-specific arc suppressors in not more than ten (10) microseconds.

17. The method of claim 16, wherein the first phase-specific arc suppressor comprises a first driver and the second phase-specific arc suppressor comprises a second driver, and wherein switching the first and second high speed switches comprises driving the first and second high speed switches with the first and second drivers, respectively.

18. The method of claim 17, wherein the first and second high speed switches are insulated gate bipolar transistors (IGBT).

19. The method of claim 18, wherein the each of the first and second phase-specific arc suppressors comprise a trigger lock which inhibit operation of an associated one of the first and second phase-specific arc suppressor for a predetermined time following an initial detection of an arc.

20. The method of claim 19, wherein the predetermined time is not more than three hundred (300) milliseconds.

\* \* \* \* \*